United States Patent [19]
Gould

[11] Patent Number: 5,760,611
[45] Date of Patent: Jun. 2, 1998

[54] FUNCTION GENERATOR FOR PROGRAMMABLE GATE ARRAY

[75] Inventor: Scott Whitney Gould, South Burlington, Vt.

[73] Assignee: International Business Machines Corporation, Armonk, N.Y.

[21] Appl. No.: 739,102

[22] Filed: Oct. 25, 1996

[51] Int. Cl.$^6$ .................................................. H03K 19/177
[52] U.S. Cl. ............................ 326/113; 326/38; 326/40
[58] Field of Search ................................. 326/112, 113, 326/114, 37, 38, 40

[56] References Cited

U.S. PATENT DOCUMENTS

| | | | |
|---|---|---|---|
| Re. 34,363 | 8/1993 | Freeman | 307/465 |
| 4,622,648 | 11/1986 | Whitaker | 326/113 |
| 4,642,487 | 2/1987 | Carter | 307/465 |
| 4,706,216 | 11/1987 | Carter | 365/94 |
| 4,758,985 | 7/1988 | Carter | 365/94 |
| 4,870,302 | 9/1989 | Freeman | 307/465 |
| 5,001,368 | 3/1991 | Cliff et al. | 307/465 |
| 5,166,547 | 11/1992 | Babakanian et al. | 307/303.2 |
| 5,198,705 | 3/1993 | Galbraith et al. | 307/465 |
| 5,198,706 | 3/1993 | Papaliolios | 307/465 |
| 5,352,940 | 10/1994 | Watson | 307/465 |
| 5,386,154 | 1/1995 | Goetting et al. | 326/44 |
| 5,418,480 | 5/1995 | Hastie et al. | 326/113 |
| 5,502,403 | 3/1996 | Liu et al. | 326/46 |
| 5,508,641 | 4/1996 | Appenzeller et al. | 326/113 |

FOREIGN PATENT DOCUMENTS 4051529936   6/1993   Japan .............................. 326/113

OTHER PUBLICATIONS

G. Boudon, et al., "Bi-CMOS XOR3/XOR-NOT3 Circuits with Pass Transistors", IBM Technical Disclosure Bulletin, vol. 32, No. 3B, Aug. 1989, pp. 415-416.

S. F. Oakland, "CMOS Selectable Nand-Nor Circuit", IBM Technical Disclosure Bulletin, vol. 33, No. 3B, Aug. 1990, pp. 385-387.

Akilesh Parameswar, et al., "A Swing Restored Pass Transistor Logic-Based Multiply and Accumulate Circuit for Multimedia Applications", IEEE Journal of Solid-State Circuits, vol. 31, No. 6, Jun. 1996, pp. 804-809.

Kazuo Yano, et al., "Top-Down Pass-Transistor Logic Design", IEEE Journal of Solid-State Circuits, vol. 31, No. 6, Jun. 1996, pp. 792-803.

Tadahiro Kuroda, et al.,"Overview of Low-Power ULSI Circuit Techniques", IEICE Trans. Electron., vol E78-C, No. 4, Apr. 1995, pp. 334-344.

Abdellatif Bellaouar, et al., "Low-Voltage Low-Power VLSI CMOS Circuit Design", Low Power Digital VLSI Design Circuits and Systems, Kluwer Academic Publishers, 1995, pp. 203-213.

*Primary Examiner*—David R. Hudspeth
*Attorney, Agent, or Firm*—Susan M. Murray

[57] ABSTRACT

A programmable logic circuit provides a variety of logic functions including AND/NAND, OR/NOR, XOR/XNOR. Selection of logic function is provided by controlling inputs, using programmable inverters and programmable multiplexers. The logic circuit can be incorporated into a field programmable gate array.

13 Claims, 5 Drawing Sheets

|  | AND/NAND (AB, $\overline{AB}$) | OR/NOR (A+B, $\overline{A+B}$) | XOR/XNOR (A ⊕ B, $\overline{A \oplus B}$) |
|---|---|---|---|
| G1 | B | $\overline{B}$ | $\overline{B}$ |
| I1 | A | A | A |
| G2 | $\overline{B}$ | B | B |
| I2 | LOW | HIGH | $\overline{A}$ |
| G3 | $\overline{B}$ | B | B |
| I3 | HIGH | LOW | A |
| G4 | B | $\overline{B}$ | $\overline{B}$ |
| I4 | $\overline{A}$ | $\overline{A}$ | $\overline{A}$ |

FUNCTION GENERATOR FOR PROGRAMMABLE GATE ARRAY

FIELD OF THE INVENTION

This invention relates in general to integrated circuit devices, and more specifically to programmable integrated circuit devices having a plurality of programmable logic cells and a programmable interconnection network.

BACKGROUND OF THE INVENTION

Programmable integrated circuits are known in the art and include programmable logic devices ("PLD's"), Programmable Array Logic ("PAL's"), and Programmable Logic Arrays ("PLA's"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field". Such configuration may be effected by using electrically programmable fusible links, antifuses, memory-controlled transistors, floating-gate transistors, or the like.

Several approaches have developed in the art for the implementation of programmable logic cells. The first, generally referred to as the Look-Up Table ("LUT") approach, involves using a memory unit inside of each logic cell which stores a user-defined output function for each of the possible combinations of input terms. For example, a 4-input, 1-output LUT may comprise a $2^4 \times 1$-bit memory. Thus a 1-bit value is defined (by the user) for each of the 16 different possible input combinations, and that value is selected (and output) when that combination occurs. However, there are actually $2^{16}$ or 56,536 possible combinations of memory states for the $2^4 \times 1$-bit memory. This large number of potential memory states may cause design problems if common fixed-library technology is employed for technology mapping user circuit designs onto LUT's.

Another approach to logic cell implementation involves using standard cells, and programmable signal selection within and about the cell. Such standard cells provide input multiplexers for selecting inputs from a wiring network around the cell and for providing those inputs to standard CMOS logic gates. Output multiplexers are used to selectively apply output logic signals produced by the logic gates to cell output nodes.

The standard CMOS logic gates within the cells may be fixed or configurable. The configurable logic gates have a control node for selecting one of a relatively small number of predetermined logic functions (e.g. 1 or 2), thus limiting the number of functions that can be performed by the standard cell (e.g. on the order of 150), as compared to an LUT cell.

In addition to the variety and number of logic functions a given cell can generate, another important concern for PGA designers is speed. One of the disadvantages of PGA's and other standard-style programmable products over custom-made ASICS is the difficulty in minimizing propagation delay. Propagation delay attributable to the interconnection circuit is reduced or minimized by providing for direct connections as well as various levels of busing across multiple cells. However, such accommodations do not reduce that portion of the propagation delay attributable to the logic cell itself. Since each logic cell may include multiple cascaded logic gates, the propagation delay of each gate can significantly add to the overall propagation delay.

What is needed, therefore, is a standard logic cell for a programmable gate array which can provide a high number of functions at high speed.

SUMMARY OF THE INVENTION

It is an object of the present invention to provide a logic circuit which can be flexibly configured to perform a large number of logic functions.

It is an object of the present invention to provide a logic cell for a programmable gate array which has a low propagation delay.

It is a further object of the present invention to provide a pass-gate logic cell for a programmable gate array.

The present invention is directed to a configurable pass-gate logic circuit including: a) a load means, including first and second transistors of a first conductivity type coupled between a first voltage potential and respective first and second output nodes, the first transistor having a gate electrode coupled to the second output node, the second transistor having a gate electrode coupled to the first output node; b) a first transistor of a second conductivity type having a first current carrying terminal connected to the first output node, a second current carrying terminal connected to a first input node, and a gate terminal connected to a second input node; c) second transistor of a second conductivity type having a first current carrying terminal connected to the first output node, a second current carrying terminal connected to a third input node, and a gate terminal connected to a fourth input node; d) third transistor of a second conductivity type having a first current carrying terminal connected to the second output node, a second current carrying terminal connected to a fifth input node, and a gate terminal connected to the fourth input node; and e) a fourth transistor of a second conductivity type having a first current carrying terminal connected to the second output node, a second current carrying terminal connected to a sixth input node, and a gate terminal connected to the second input node. The circuit can be programmably configured to provide a variety of logic functions including OR/NOR, AND/NAND and XOR/XNOR.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

DETAILED DESCRIPTION OF THE PREFERRED EMBODIMENT

The following conventions will be used herein. In the figures, a bar over a letter indicates an inverted form of the signal (e.g. a Q with a bar over it indicates the inversion of Q). In the written description, inversions are indicated by an apostrophe at the end of the signal name (e.g. Q' is the inversion of Q).

Figure 1:
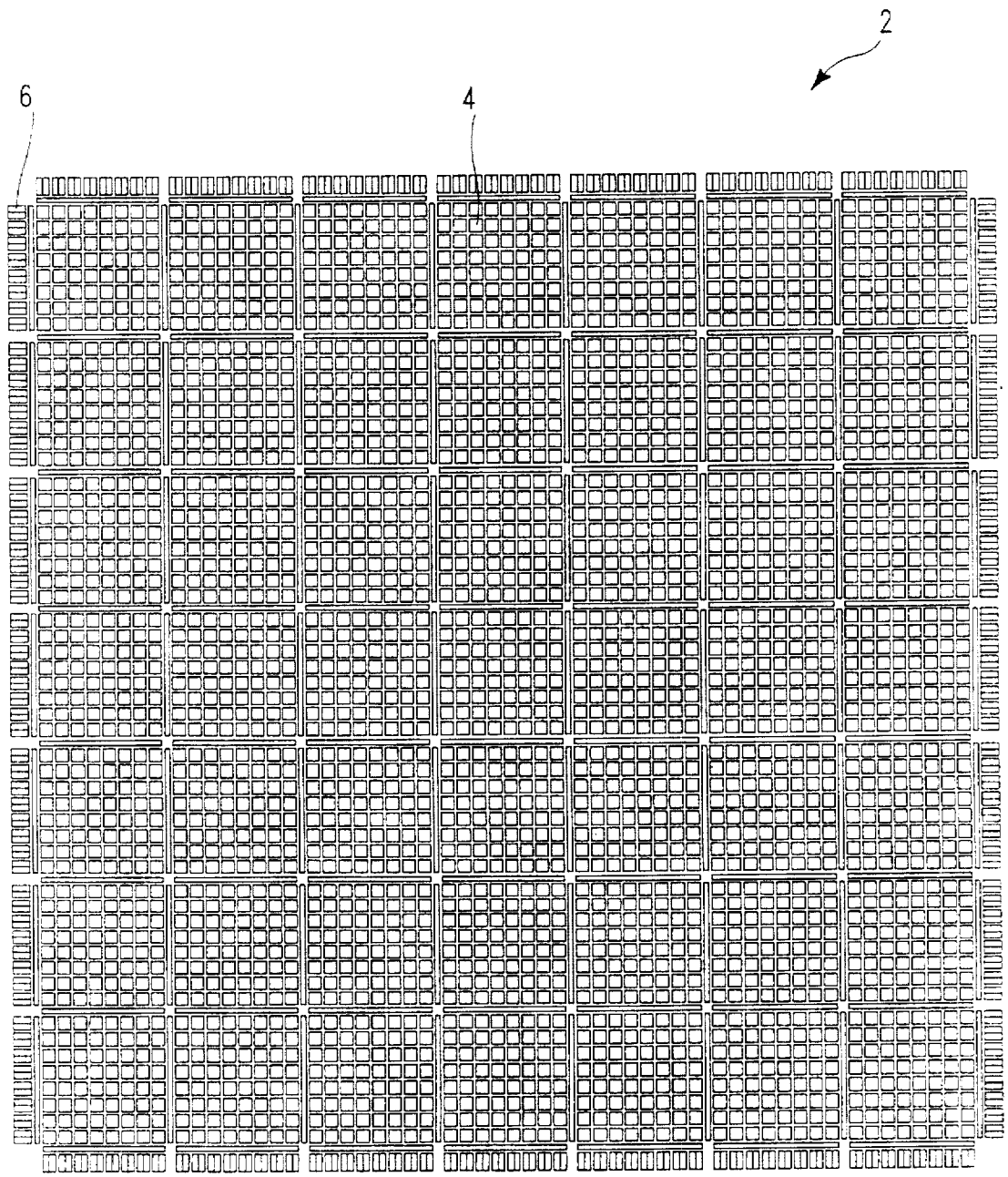
FIG.1 illustrates a programmable gate array having a plurality of programmable logic cells pursuant to the principles of the present invention arranged therein.

With reference to FIG. 1, there is shown an exemplary layout of a programmable gate array 2 comprising a plurality of logic cells 4. In this particular example, the plurality of programmable logic cells comprises a 56×56 array of logic cells 4 divided into sectors of cells, wherein each sector is defined by an 8×8 group of logic cells 4. Also depicted are input/output pins (I/O pins) 6 along the perimeter of the array 2 which may be used for data input and output. In addition, certain pins may be used for configuration pins for programming the programmable elements of the array 2, or as clock pins or reset pins.

Figure 2:
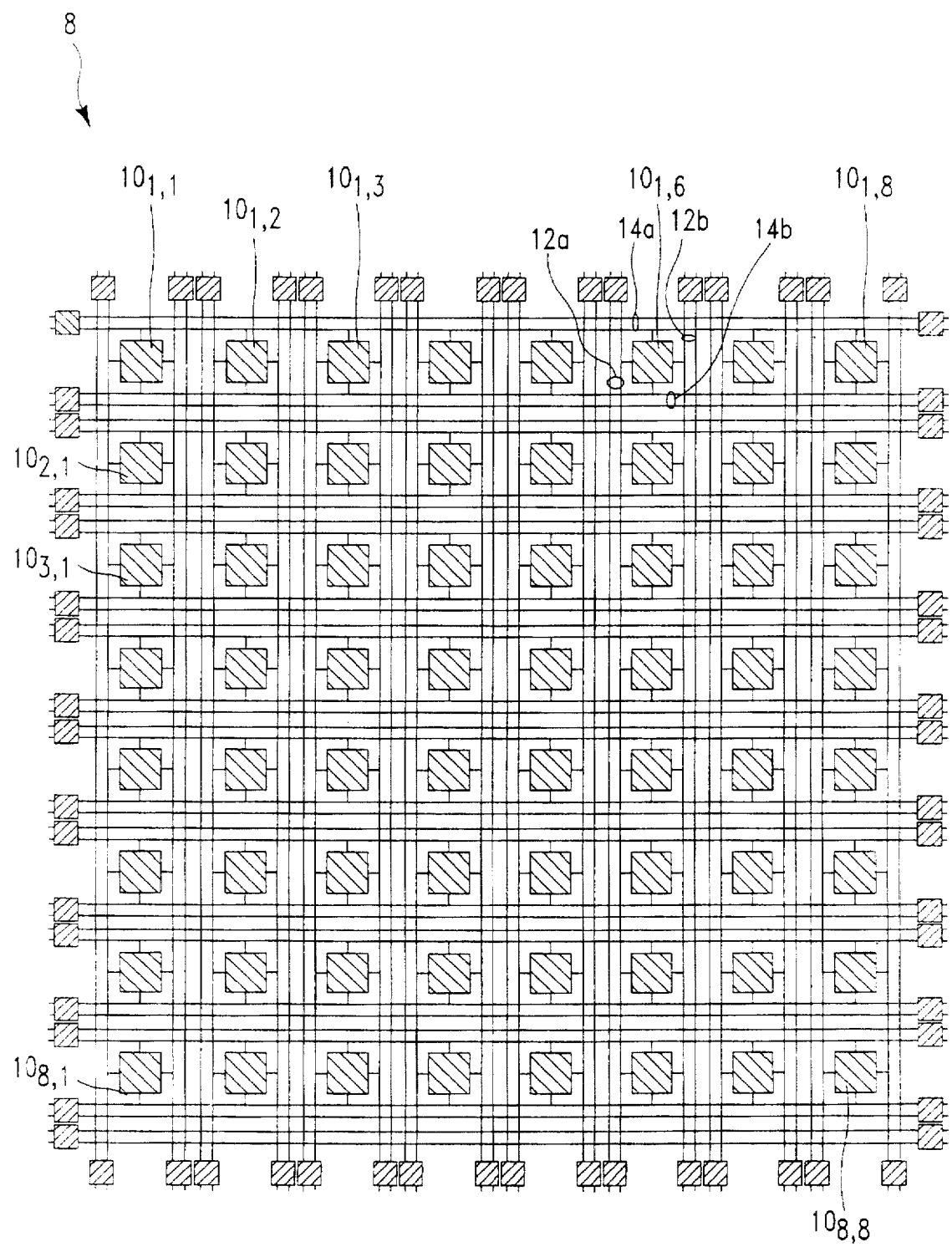
FIG. 2 depicts a portion of a programmable gate array having a plurality of programmable logic cells pursuant to the principles of the present invention arranged therein and an interconnection network connecting the programmable logic cells.

With reference to FIG. 2, there is shown a single sector 8 of programmable logic cells of the array of FIG. 1. A single sector 8 comprises logic cells $10_{1,1}$ to $10_{8,8}$. With reference to logic cell $10_{1,6}$, the logic cell is shown generally surrounded by vertical interconnect conductors 12a and 12b, and horizontal interconnect conductors 14a and 14b. These horizontal and vertical interconnect conductors are positioned between each row and column of the array and provide connections between any two logic cells in the array, or between any logic cell in the array and the input/output pins. The interconnect conductors together form the overall interconnect network of the programmable array. Programmable elements within the interconnect network (not shown) may be provided in addition to the programmable elements provided in programmable logic cells to allow for more flexible routing of signals along the interconnect network. For example, the programmable element may provide for segmenting the interconnection network such that various levels of busing (e.g. local buses, express buses etc.) are available to each logic cell.

Figure 3:
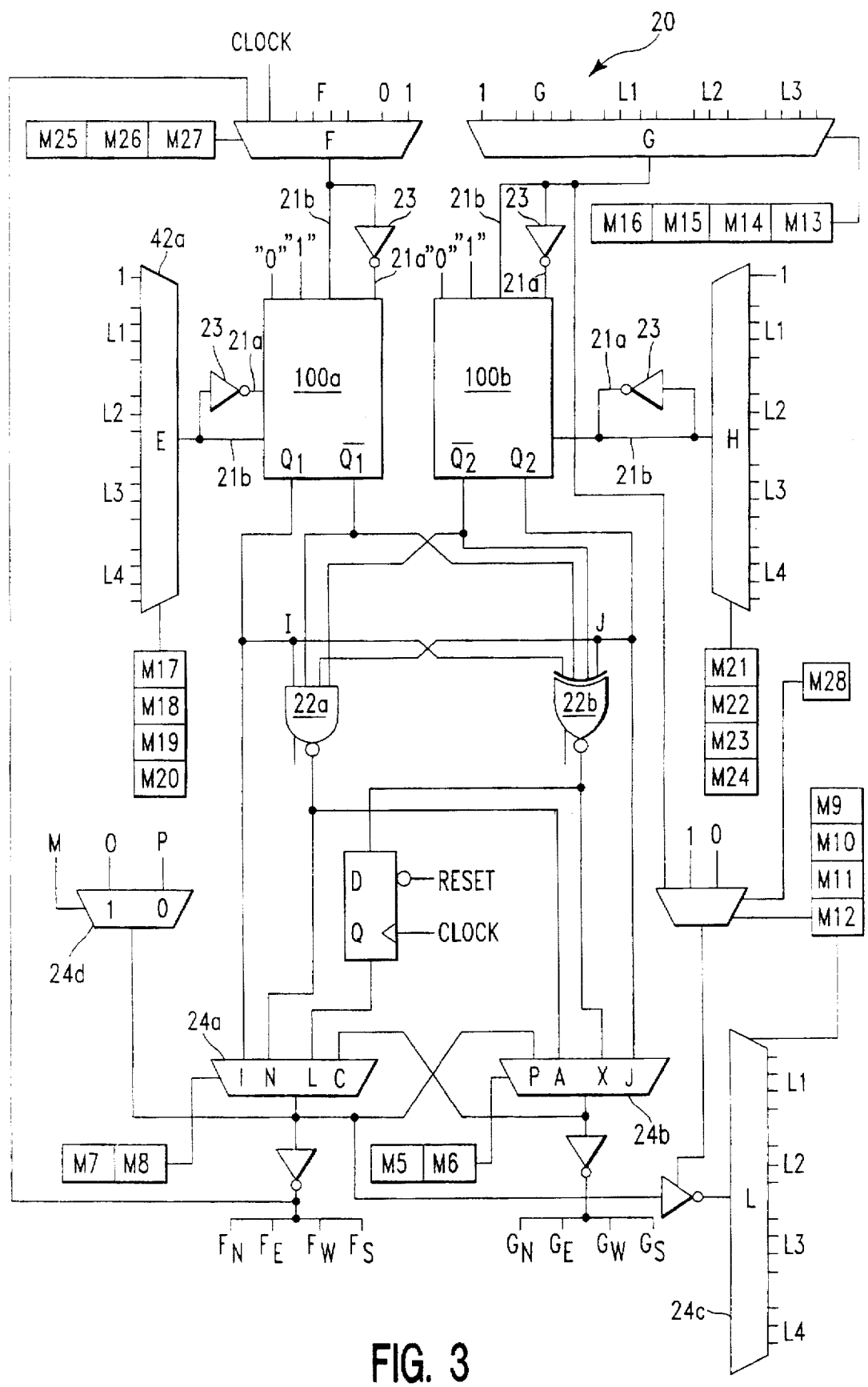
FIG. 3 depicts an exemplary logic cell pursuant to the principles of the present invention including a multifunction pass gate logic generator.

FIG. 3 depicts an exemplary programmable logic cell 20 embodying the present invention. The logic cell 20 has various programmable elements which may be controlled by SRAM memory bits (indicated by designation Mn where n is an integer). Programmable input multiplexers E, F, G and H are provided for input selection and may comprise pass gate multiplexers. The selectable inputs may include, for example, local bus inputs L1–L4, clock input(s) CLOCK or direct connections (e.g. F, G) from adjacent logic cells. The inputs selected by programmable input multiplexers E and F, and G and H are provided to multifunction pass gate logic generators 100a and 100b respectively in an inverted 21a or uninverted form. The uninverted form of the inputs is preferably delayed by an amount approximately equal to the delay of inverters 23. Multifunction pass gate logic generators 100a and 100b are configurable to flexibly provide a variety of logic functions as described in further detail hereinbelow. Multifunction pass gate logic generators 100a and 100b may provide output(s) Q (and/or Q') to downstream logic gates, such as logic gates 22a and 22b. Downstream logic gates 22a and 22b, which may be implemented as pass-gate logic, provide for more complex logic functions to be performed and programmable output multiplexers 24a–24d, which may comprise pass gate multiplexers, route the outputs of logic gates 22a and 22b to the interconnect network in accordance with programming information stored in the associated controlling SRAM memory bits.

Figure 4:
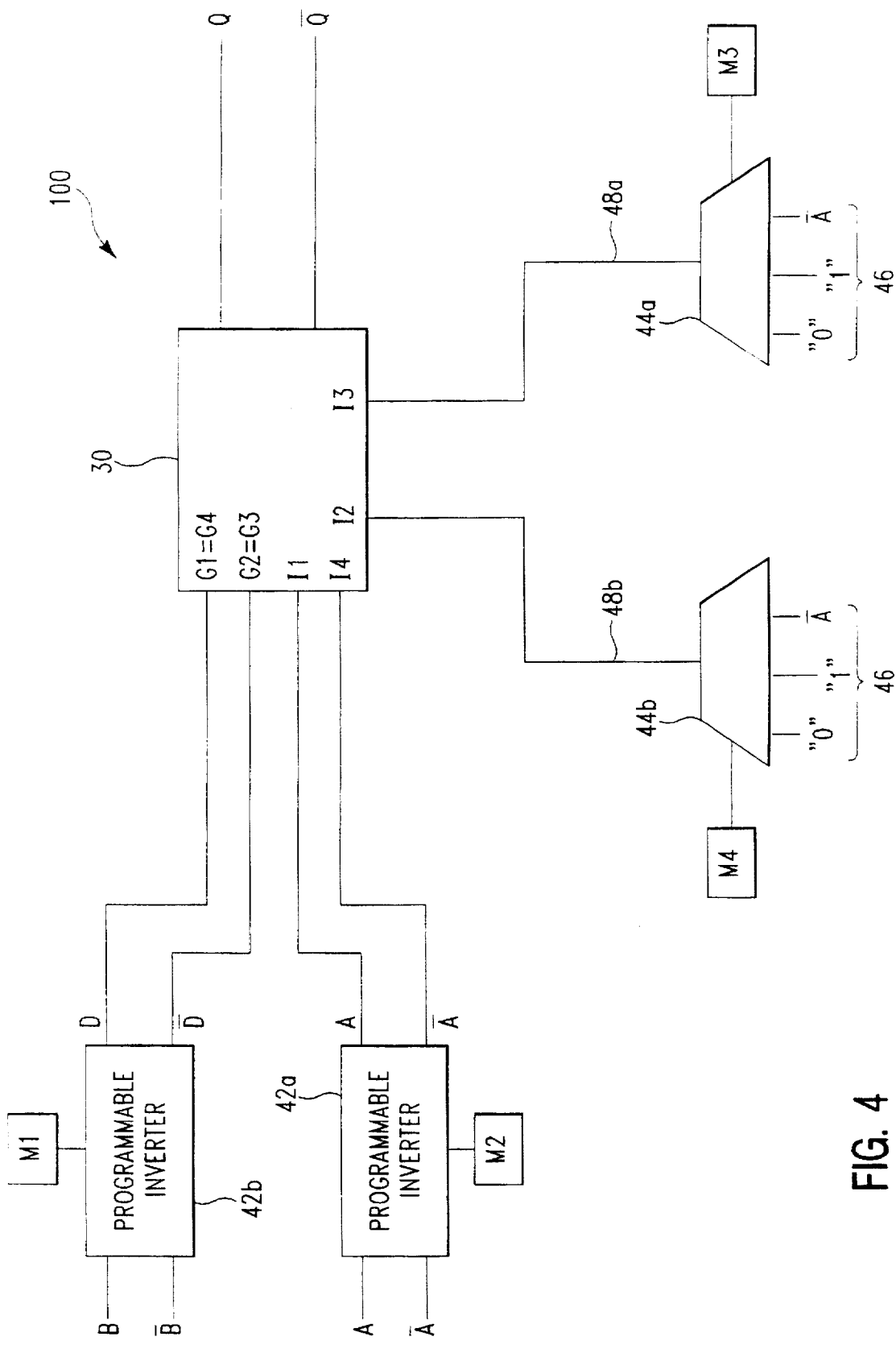
FIG. 4 depicts a multifunction pass gate logic generator in accordance with the principles of the present invention including a multifunction pass gate logic circuit.

The multifunction pass gate logic generators 100 (a and b) of the logic cell 20 will now be described in detail with reference to FIGS. 4, 5 and 6. With reference to FIG. 4, there is shown a dual input multifunction pass gate logic generator 100. The generator 100 includes a multifunction pass gate logic circuit 30, programmable inverters 42a and 42b, and programmable selectors 44a and 44b.

Figures 5, 6:
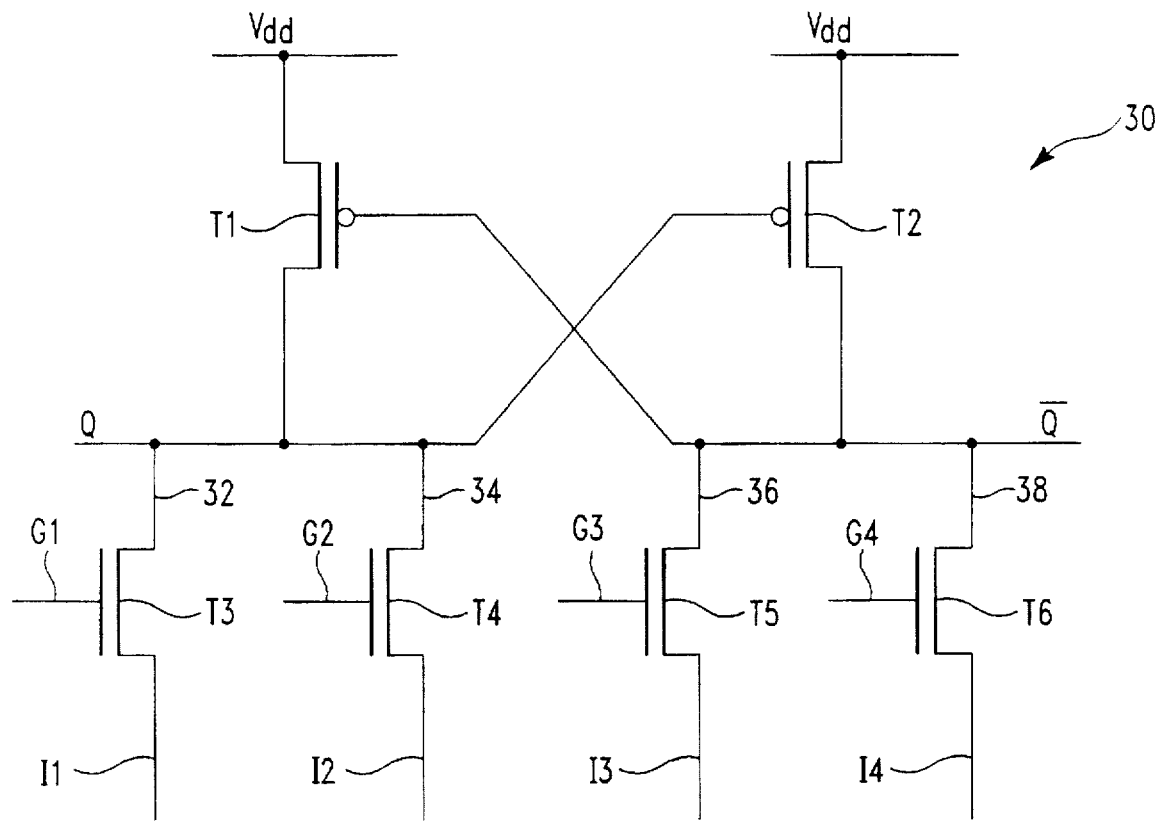
FIG. 5 depicts a multifunction pass gate logic circuit in accordance with the principles of the present invention.
FIG. 6 is a table showing the inputs for the logic circuit of FIG. 5 which are needed to produce logic functions AND/NAND, OR/NOR, XOR/XNOR on the Q and Q' outputs.

With reference to FIG. 5 there is shown in further detail the multifunction pass gate logic circuit 30. Multifunction passgate logic circuit 30 includes a load portion including p-channel field effect transistor (PFET's) T1 and T2, and further includes n-channel field effect transistors (NFET's) T3, T4, T5 and T6. P-channel FET's T1 and T2 are coupled between power supply voltage Vdd and respective complementary output nodes Q and Q'(e.g. NOT Q). The gates of FET's T1 and T2 are cross-coupled to the respective output nodes Q' and Q. Pass gate NFET's T3 and T4 each have a respective first current carrying terminal 32 and 34 coupled to output node Q, a respective second current carrying terminal I1 and I2 for receiving an input signal and a respective gate terminal G1 and G2 for receiving an input signal. Pass gate NFET's T5 and T6 each have a respective first current carrying terminal 36 and 38 coupled to output node Q', a respective second current carrying terminal I3 and I4 for receiving an input signal and a respective gate terminal G3 and G4 for receiving an input signal.

The multifunction pass gate logic circuit 30 shown in FIG. 5 can provide a number of logic functions by programmably varying the inputs received at the gates G1–G4, and second current carrying terminals I1–I4 of pass gate FET's T3–T6. Shown in FIG. 6 are the inputs needed at gates G1–G4 and terminals I1–I4 to produce the logical functions: a) A AND B (at Q output); A NAND B (at Q' output); b) A OR B (at Q output); A NOR B (at Q' output); and c) A XOR B (at Q output); A XNOR B (at Q' output). For example, to produce A OR B, A is provided to I1, A' to I4, B to G2 and G3, B' to G1 and G4, while I2 is held HIGH and I3 is held LOW. If either A or B is HIGH, transistors T5 or T6 conduct to pull Q' LOW, thus turning on T1 and pulling Q HIGH. If both A and B are LOW T3 conducts, thus pulling Q LOW, causing T3 to conduct and pulling Q' HIGH.

Upon examination of FIG. 6, it can be observed that G1 and G4 share common inputs and that G2 and G3 share common inputs which are inverses of the inputs for G1/G4. In addition, I1 always receives the same input, A, regardless of the desired function, while I4, always receives the same input, A', regardless of the desired function.

Other embodiments of the multifunction pass gate logic circuit 30 shown in FIG. 5 can also be employed. Fewer transistors may be used with a reduced set of logic functions that can be provided. For example, removal of transistor T5 will result in a circuit capable of performing only the NAND/AND functions. Alternatively, removal of transistor T4 will result in a circuit capable of performing the OR/NOR functions. Additionally, alternate types of pass-gate logic may also be used. FIG. 5 is shown with differential cascode voltage switch with pass-gate (DCVSPG) logic. However, other known types of pass-gate logic which have different loading transistor arrangements, such as, swing restored pass-transistor logic (SRPL), or complementary pass-transistor logic (CPL) could also be used.

Referring back to FIG. 4, programmable inverter 42b receives at an input logic signal B, and provides complementary outputs D and D'. Outputs D/D' represent input signal B/B' or B'/B, depending on the programming state provided by SRAM memory M1. Output D is coupled to gates G1 and G4 of respective pass gate FET's T3 and T6 of the multifunction pass gate logic circuit 30, while output D' is coupled to gates G2 and G3 of respective pass gate FET's T4 and T5 of the multifunction pass gate logic circuit 30. Programmable inverter 42a receives at an input logic signal A, and provides complementary outputs A and A' which are respectively coupled to respective current carrying terminals I1 and I4 of pass gate FET's T3 and T6 of the multifunction pass gate logic circuit 30.

In one embodiment, programmable inverters 42a and 42b can each be implemented by replicating the multifunction pass gate logic circuit 30 of FIG. 1, and configuring it to provide an XOR/XNOR function. More particularly, with reference to programmable inverter 42b, the logic signals B and B' can be provided as variable inputs respectively to gates G2/G3 and G1/G4. Inputs I1/I3 and I2/I4 can be controlled by static random access memory M1 (SRAM) to programmably invert (or not invert) the logic signals B and B'. For example, if it is desired to provide B on output D (and B' on D'), SRAM M1 would cause I1 and I3 to be LOW and I2 and I4 to be HIGH. Likewise, if it is desired to provide B' on output D, SRAM M1 can be set to cause I1 and I3 to be HIGH and I2 and I4 to be LOW.

With continued reference to FIG. 4, programmable selectors 44a and 44b receive a plurality of inputs 46, including, in this embodiment, both fixed and variable inputs. Fixed inputs are shown as "0"(or a logic LOW level), "1"(or a logic HIGH level). Variable inputs A and A' are respectively shown for respective selectors 44a and 44b. Selectors 44a and 44b are preferably pass gate multiplexers which are controlled by one or more respective static random access memory (SRAM) arrays M3 and M4 to select one of the inputs 46 for transmission at the respective outputs 48a and 48b. For example, in the specific implementation shown in FIG. 4, each of the memory arrays M3 and M4 may comprise two memory cells, but the number of memory cells can vary with the desired number of inputs 46. The SRAM arrays are directly or indirectly (through decoders) tied to the gates of the pass gates within the pass gate multiplexer thus controlling the states of the pass gates, each pass gate associated with one of the plurality of inputs. In addition, M3 and M4 can be implemented as distinct and independent SRAM arrays or as a common array coupled to both selectors 44a and 44b.

As discussed above, various technologies are known to those skilled in the art to provide array programmability. Any of these techniques, or variants thereof, can be used to program the logic cell of the present inventions. Mask programming techniques include customizing the deposition of the final layers of metallization of an otherwise generally designed integrated circuit. Laser programming techniques involve customizing the metallization layers following their deposition. Fusible links or antifuses can be employed and offer permanent (non-volatile) programming. Erasable programmable read only memory ("EPROM") and electrically erasable programmable read only memory ("EPROM") devices can be used and offer semi-permanent programming. EPROMS AND EEPROMS are both electrically programmable and hold their states, even if power is removed. Special erase procedures can be used, however, to reconfigure the devices. Finally, volatile random access memory ("RAM") devices are also available which are fully programmable and reprogrammable, but which lose their programmed state if power is removed. These and other techniques for programming arrays are known to those in the art.

While the invention has been particularly shown and described with reference to preferred embodiments thereof, it will be understood by those skilled in the art that various other changes in form and detail may be made therein without departing from the spirit and scope of the invention.

What is claimed is:

1. A configurable pass-gate logic circuit comprising:

load means, comprising first and second transistors of a first conductivity type coupled between a first voltage potential and respective first and second output nodes, the first transistor having a gate electrode coupled to the second output node, the second transistor having a gate electrode coupled to the first output node;

first transistor of a second conductivity type having a first current carrying terminal connected to the first output node, a second current carrying terminal connected to a first input node, and a gate terminal connected to a second input node;

second transistor of a second conductivity type having a first current carrying terminal connected to the first output node, a second current carrying terminal connected to a third input node, and a gate terminal connected to a fourth input node;

third transistor of a second conductivity type having a first current carrying terminal connected to the second output node, a second current carrying terminal connected to a fifth input node, and a gate terminal connected to the fourth input node; and a fourth transistor of a second conductivity type having a first current carrying terminal connected to the second output node, a second current carrying terminal connected to a sixth input node, and a gate terminal connected to the second input node.

2. The circuit as recited in claim 1 wherein the sixth input node and the first input node have complementary inputs.

3. The circuit as recited in claim 1 wherein the second input node and the fourth input node have complementary inputs.

4. The circuit as recited in claim 1 wherein the third input node and the fifth input node have complementary inputs.

5. The circuit as recited in claim 1 wherein the second, third, fourth and fifth input nodes are programmable to perform one of the group of logic functions including AND, NAND, OR, NOR, XOR and XNOR.

6. The circuit as recited in claim 1 further comprising:

a first programmable inverter for receiving a first input and for programmably providing inverted or non-inverted outputs, one of the outputs coupled to the second input node, the other of the outputs coupled to the fourth input node;

a second programmable inverter for receiving a second input and for programmably providing inverted or non-inverted outputs, one of the outputs coupled to the first input node, the other of the outputs coupled to the sixth input node;

a first programmable selector for coupling one of a plurality of third inputs to the third input node; and a second programmable selector for coupling one of a plurality of fourth inputs to the fifth input node.

7. The circuit as recited in claim 6 wherein the third and fourth inputs include a logical LOW level, a logical HIGH level and the second input.

8. In a field programmable gate array, a logic cell comprising the circuit as recited in claim 1.

9. In a field programmable gate array, a logic cell comprising the circuit as recited in claim 5.

10. In a field programmable gate array, a logic cell comprising the circuit as recited in claim 6.

11. A programmable pass-gate logic inverter comprising:

load means, comprising first and second transistors of a first conductivity type coupled between a first voltage potential and respective first and second output nodes, the first transistor having a gate electrode coupled to the second output node, the second transistor having a gate electrode coupled to the first output node;

first transistor of a second conductivity type having a first current carrying terminal connected to the first output node, a second current carrying terminal connected to a first control input node, and a gate terminal connected to a first input node, the first input node for receiving a first logic signal;

second transistor of a second conductivity type having a first current carrying terminal connected to the first output node, a second current carrying terminal connected to a second control input node, and a gate terminal connected to a second input node, the second input node for receiving a second logic signal, the second logic signal being the complement of the first logic signal;

third transistor of a second conductivity type having a first current carrying terminal connected to the second output node, a second current carrying terminal connected to the first control input node, and a gate terminal connected to the second input node;

a fourth transistor of a second conductivity type having a first current carrying terminal connected to the second output node, a second current carrying terminal connected to the second control input node, and a gate terminal connected to the first input node; and programming means coupled to the first and second control input nodes for selectively providing at the first and second output nodes an inverted or non-inverted form of the first and second logic signals.

12. The circuit as recited in claim 11 wherein the programming means comprises static random access memory.

13. In a field programmable gate array, a logic cell comprising the circuit as recited in claim 11.

* * * * *